US005371466A

United States Patent [19]
Arakawa et al.

[11] Patent Number: 5,371,466
[45] Date of Patent: Dec. 6, 1994

[54] MRI RF GROUND BREAKER ASSEMBLY

[75] Inventors: Mitsuaki Arakawa, Hillsborough, Calif.; Masahiro Arakawa, Cambridge, Mass.

[73] Assignee: The Regents of the University of California, Oakland, Calif.

[21] Appl. No.: 921,107

[22] Filed: Jul. 29, 1992

[51] Int. Cl.[5] .............................................. G01V 3/00
[52] U.S. Cl. ........................................ 324/322; 324/318
[58] Field of Search ................... 324/322, 318, 314; 333/12; 334/821, 820, 822

[56] References Cited

U.S. PATENT DOCUMENTS

| | | | |
|---|---|---|---|
| 4,682,125 | 7/1987 | Harrison et al. | 333/12 |
| 4,922,204 | 5/1990 | Duerr et al. | 324/318 |
| 5,294,886 | 3/1994 | Duerr | 324/318 |

*Primary Examiner*—Louis Arana
*Attorney, Agent, or Firm*—Nixon & Vandehye

[57] ABSTRACT

A very small sized and highly efficient RF ground breaker for use in magnetic resonance imaging (MRI) is constructed on a printed circuit board. A variable capacitor is used to tune the ground breaker to block the desired radio frequency signals from passing along the outside of a coaxial cable conductor. Preferably, the printed circuit board is double-sided with the ground breaker components being mounted on both sides and with RF conductors being mounted within recesses and serving to interconnect printed circuit traces from one side of the circuit board with those on the other side. In a double ground breaker version, undesirable coupling between proximate RF ground breaker components associated with separate channels are purposely inter-coupled by capacitance designed to substantially cancel unwanted inter-channel coupling effects.

22 Claims, 5 Drawing Sheets

MRI RF GROUND BREAKER ASSEMBLY

BACKGROUND AND SUMMARY OF THE INVENTION

This invention relates to radio frequency interference (RFI) chokes designed to impede the flow of spurious RF currents along the outside of an outer coaxial cable conductor. The invention has particular application to an improved magnetic resonance imaging (MRI) system where the coaxial cable RFI choke assembly is employed in connection with at least one RF coaxial cable transmission line utilized to couple MRI processing circuits with a remotely located RF coil assembly (e.g., located in a nuclear magnetic resonance polarizing magnet, magnetic gradient coils and the like).

The problem of spurious RF currents conducted on the outside of MRI RF coaxial cable transmission lines has been previously noted and addressed in related commonly assigned U.S. Pat. No. 4,682,125, naming Harrison et al as inventors and entitled "RF Coil Coupling for MRI with Tuned RF Rejection Circuit Using Coax Shield Choke" (see FIGS. 1 and 2A). It is also believed to have been addressed by earlier commercial devices (e.g., the Toshiba "QD Brain Coil" marketed in at least Japan for more than one year) which have used a factory adjusted tuning capacitor (instead of a movable conductor core) for a single channel RF breaker circuit box affixed to an MRI RF coil. It appears from available text to be connected to printed circuit board ground potential and it is hermetically encased in a conductive housing box approximately 2×1.25×1.5 inches in dimension. A separate such breaker is used for each QD coil channel and they are separated by about 20 centimeters. Coaxial connectors are mounted to the hermetically sealed conductive box (see FIG. 2B).

In the earlier Harrison et al prior art, an MRI RF choke is realized by forming a coiled section of flexible coaxial cable transmission line with a lumped and fixed capacitance connected to the coaxial braid in parallel across the coil. A conductive tuning rod is positioned within the center of the coiled coaxial cable section so as to trim the parallel resonant frequency to a desired value. The exemplary embodiment described by Harrison et al resulted in a single channel RF choke assembly approximately six inches long and about 1.5 inches in outside diameter. Such a bulky RFI assembly is poorly suited for location directly in or on an MRI RF coil. Interconnecting RF cables are clumsy at best and easily damaged by mishandling during use or when changing RF coil assemblies (e.g., typically requiring unscrewing of a dangling bulky unit).

Even if the physical size of the prior art RF ground breaker is straightforwardly reduced as much as possible, it is still too large for optimum convenient use and there are still other problems as well. For example, the exemplary Harrison et al embodiment was tuned by moving a conductive rod inside the inductor and this is sometimes difficult for use with specific coils. Furthermore, the coaxial cables emanating from the MRI RF coils often have to be bunched together for acceptable operation and/or service. Since the relatively large Harrison et al type RF ground breakers are typically located at least a short distance away from the RF coil itself with transmission lines to the RF coils at the image volume, this bunching of cables often leads to degradation of the quality factor Q associated with the parallel resonant tuned RF ground breaker circuits. Thus, the desired RF "ground breaking" isolation function is itself impaired.

Although not as much is known about other commercially available capacitively-tuned MRI RF ground breakers, observation of the Toshiba QD Brain Coil single channel breakers has disclosed that they are widely separated from one another in the RF coil apparatus and further isolated by individual hermetically sealed conductively shielded housings.

These problems have led us to a new more compact and efficient RF ground breaker design for MRI applications. For example, in our new design, we incorporate a variable capacitor to more simply and reliably tune the parallel resonant ground breaker circuit to the desired frequency range. Furthermore, by making the ground breaker assembly small enough to actually fit directly on or inside the RF coil (e.g., inside a "QD" or quadrature-detection head coil), bunched RF transmission lines occur only downstream of the RFI choke assembly thus avoiding Q degradation problems.

Since many MRI RF coil structures actually comprise a plurality of coils (e.g., a pair of quadrature-detection coils in a typical head coil), our preferred embodiment actually constitutes a double ground breaker formed on a single printed circuit substrate. Undesirable coupling between the closely proximate ground breaker assemblies is neutralized or cancelled by appropriate inter-channel capacitance of coupling. There is no necessity for elaborate hermetic shielding or the like.

Whether our single or double (or more) channel RF ground breakers are used, they are preferably formed on a single printed circuit board (PCB). In addition, the printed circuit board structure is preferably double sided so that some of the ground breaker circuit components may be located on both sides of the printed circuit board structure. In the preferred exemplary embodiments, standard RF coaxial cable connectors are mounted (in PCB recesses) to printed circuit conductive traces on both sides of the printed circuit board (thus serving to assist in interconnection of both sides of the printed circuit board while at the same time providing a compact and robust physical mounting for an RF connector).

We have devised several exemplary types of single channel ground breakers. A first straight single channel type has RF coaxial connectors disposed at opposite sides or ends of the printed circuit board structure. A second "bent" single channel type has RF connectors projecting from the same side of the printed circuit board. For the most part, they perform equally well although in some cases, it has been observed that the bent single ground breaker may actually perform better. It has been discovered that the Q quality factor of an MRI RF coil using these new ground breakers is better than when the prior art ground breakers are utilized. Furthermore, the newer ground breakers of this invention exhibit a much lower insertion loss than the prior art ground breakers. For example, the newer ground breakers have exhibited insertion losses on the order of about 0.070 dB, while prior art ground breakers exhibit insertion losses on the order of 0.110 dB to 0.141 dB.

As will be appreciated by those in the art, a relatively high voltage rated capacitor should be used for MRI applications. For example, it is estimated that the capacitors utilized should be capable of withstanding at least 600 volts for a 2 kilowatt RF MRI circuit. Of course, such voltage requirements can be met by either utilizing a single high voltage rated capacitor or a plurality of lower voltage rated capacitors connected in series. When series connected variable capacitors of approximately equal voltage ratings are utilized, they should be adjusted approximately by equal amounts so as to maintain the divided voltage across the two capacitors as uniform as possible.

To reduce interference between the two channels of a "double" (or more channel) ground breaker, a neutralizing capacitor (or capacitors) is coupled between the ground breakers.

The MRI RFI ground breakers of this invention are physically so small and compact that they can be located on or inside an MRI RF coil. They are easily manufactured, tuned and handled. Two or more ground breakers can be located in a very small space. They are also very stable in performance and can be fabricated using PCB in common with the MRI RF coil itself and without the need for elaborate hermetic shielding.

These as well as other objects and advantages of this invention will be more completely understood and appreciated by carefully reading the following detailed description of presently preferred exemplary embodiments of this invention taken in conjunction with the accompanying drawings, of which:

Figure 1:
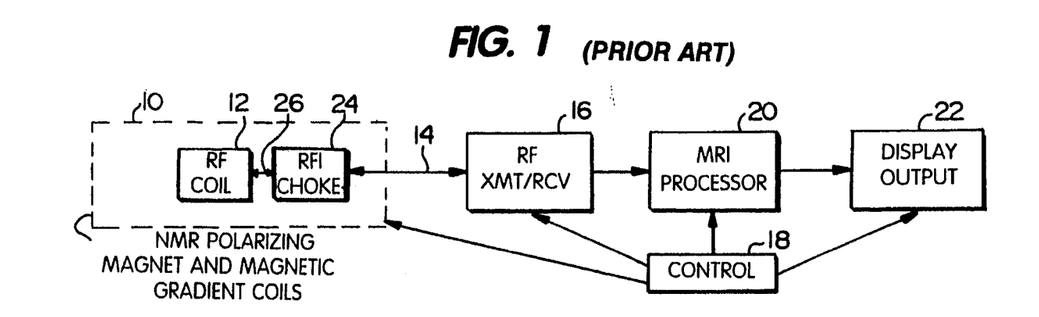
FIG. 1 is an abbreviated schematic depiction of a prior art MRI system utilizing a prior art MRI RFI choke.

FIG. 1 depicts the prior art system of Harrison et al (U.S. Pat. No. 4,682,125). As shown in the abbreviated schematic depiction, an MRI system typically includes a very large NMR polarizing magnet (e.g., a permanent magnet, an electromagnet or some combination thereof) and gradient coils 10. The magnetic gradient coils are typically pulsed to provide different gradient fields at different times in the imaging process whereas a large nominally static magnet creates a background polarizing field for NMR nuclei. Located within this rather massive assembly 10 is at least one RF coil structure 12 which communicates via transmission line 14 with external RF transmission and reception circuits 16. Suitable control circuits 18 control the magnetic gradient coils as well as the RF transmit/receive section 16, and MRI image processor 20 and, possibly, even a display output 22. As will be appreciated by those in the art, sub-systems 16, 18, 20 and 22 are typically located outside a shielded gantry room which houses the magnet and magnetic gradient coils 10. Accordingly, transmission line 14 is typically several meters in length.

The desired MRI RF signals are transmitted inside coaxial cable 14. However, as earlier indicated, spurious RF fields of predetermined frequency (e.g., within about 500 KHz of a 15 MHz center frequency for a 0.35 Tesla main magnetic field $B_0$) may couple to the outside of the coaxial cable 14 and thus contaminate the MRI process. The Harrison et al RFI choke 24 was therefore inserted serially into coaxial cable 14 so as to substantially impede the flow of such spurious signals.

Figure 2A:
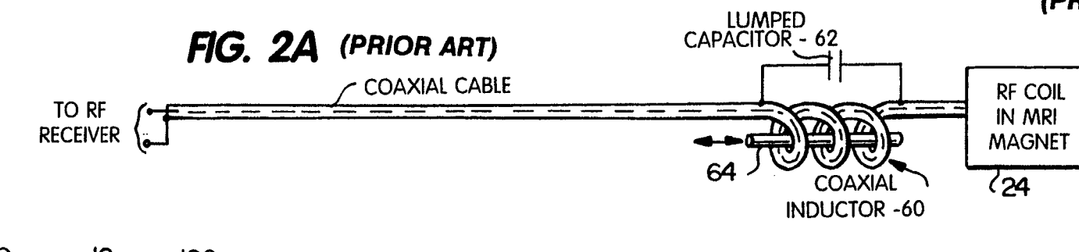
FIG. 2A is a more detailed depiction of the prior art MRI RFI choke construction shown in FIG. 1.
Figure 2B:
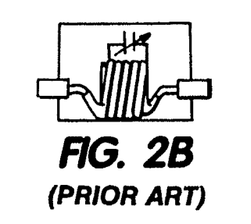
FIG. 2B depicts another prior art MRI RFI choke, this one using a variable tuning capacitance.

However, as depicted in FIG. 1, the prior art Harrison et al RFI choke 24 typically was connected to the RF coil structure 12 via a significant length of transmission line 26. For example, the RFI choke 24 might be permanently located approximate an edge of the main magnet gantry while a few feet of interconnecting cable 26 provided mobility to the RF coil structure 12. Where plural RF coils 12 are utilized (e.g., a pair of quadrature detection coils is typically utilized for head imaging), a pair of cables 26 run in close proximity to one another (and subject to variable "bunching" as one or both of the RF coil structure 12 and RFI choke 24 is moved relative to the other) and Q degradation effects have been noticed (not to mention relatively difficult tuning of the prior art RFI choke as depicted in FIG. 2A where the parallel resonant circuit of lumped capacitor 62 and coaxial inductors 60 was tuned by movement of conductive rod While the prior art Toshiba single channel ground breaker (depicted in FIG. 2B) apparently does address some of these problems (e.g., they are mounted on or within the QD coil structure), they still fail to provide a truly optimum solution in all respects.

Figure 3:
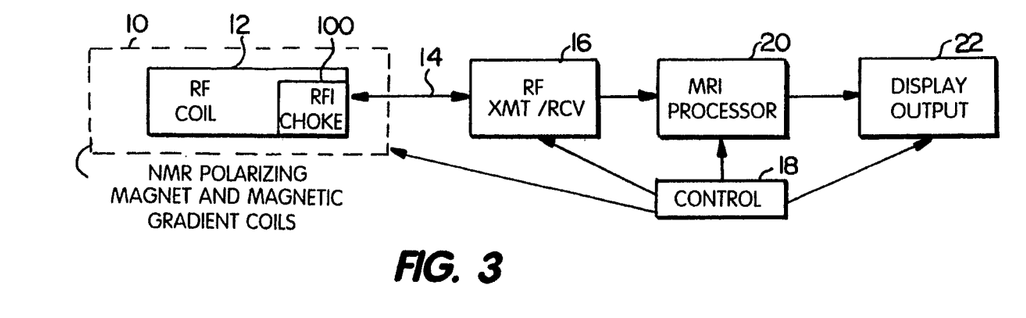
FIG. 3 is an abbreviated schematic diagram of an improved MRI system utilizing the RFI choke of this invention when connected with the RF coil structure.
Figure 4:
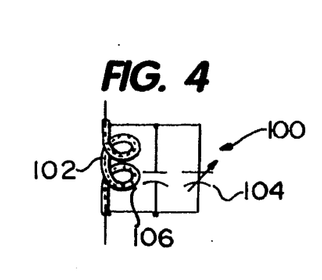
FIG. 4 is a schematic diagram of a single channel RFI choke in accordance with this invention.

Now, as depicted in FIG. 3, an improved MRI system is realized by incorporating our new RFI choke 100 directly with the RF coil structure 12 thus eliminating any transmission lines 26 of significant length which are otherwise "bunched" together or otherwise subject to significant inter-channel coupling effects. As depicted in the schematic diagram of FIG. 4, each channel of the exemplary RF ground breaker 100 includes a parallel resonant circuit of the coiled outer conductor of coaxial cable 102 connected in parallel with a fixed capacitance and a variable tuning capacitance 104. In this manner, tuning of each RF ground breaker channel can be more easily accomplished. Furthermore, since there is no need for hermetic shielding, the tuning capacitance can be optimally adjusted at any time-including field adjustments throughout the MRI system life.

Figure 5A:
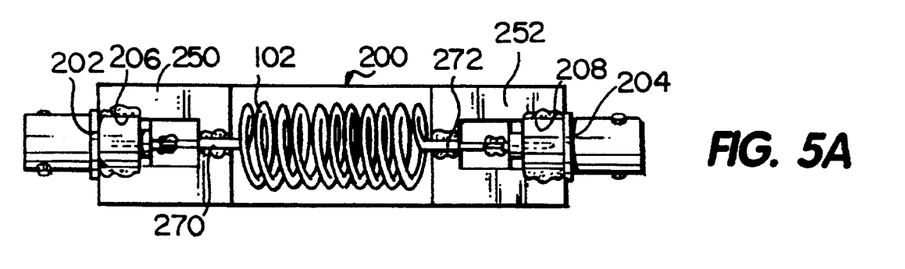
FIGS. 5A–5D are top and bottom views of a "straight" single channel ground breaker (and of its printed circuit board conductive traces) in accordance with a first embodiment of this invention.
Figure 5B:
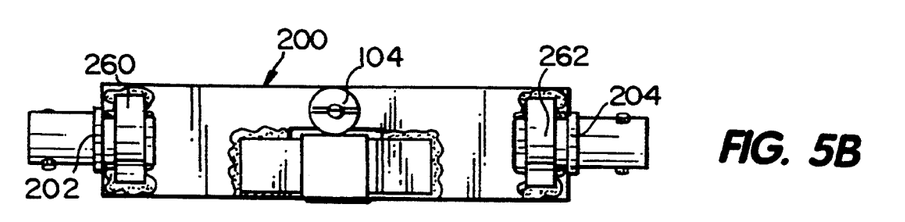

FIGS. 5A and 5B depict the top and bottom view of a first single channel embodiment of our new RF ground breaker. As will be appreciated, such ground breaker may be viewed as a parallel resonant LC circuit (see FIG. 4) constructed on a printed circuit board 200. Conventional RF coaxial cable connectors 202 and 204 may be used to facilitate connections with the RF coil and transmission line 14. Recesses 206 and 208 for the RF coaxial connectors are cut into opposite ends of the printed circuit board 200 (e.g., for one popular BNC connector size the recesses may be approximately ⅜ inch square). The top and bottom surfaces of the printed circuit board 200 are depicted without attached components in FIGS. 5C and 5D so that printed circuit conductor traces 250 and 252 on the top side and conductive traces 254 and 256 on the bottom side of the printed circuit board 200 more easily can be seen.

Figure 5C:
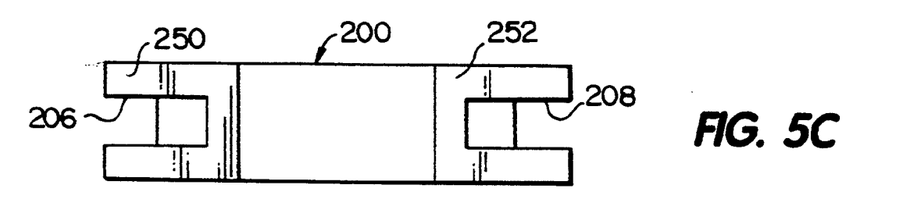
Figure 5D:
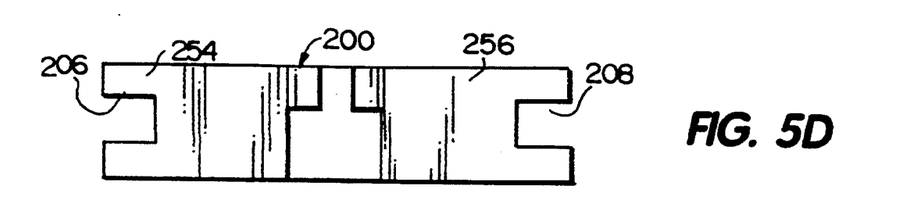
Figure 6A:
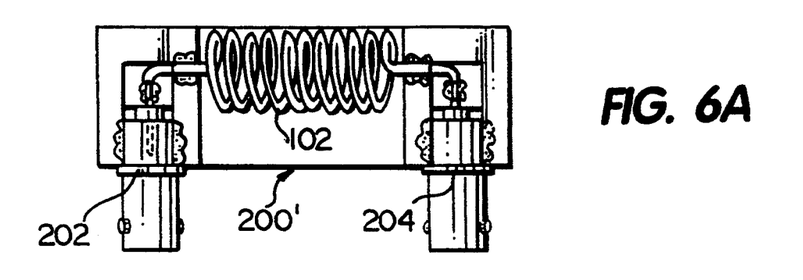
FIGS. 6A–6D are top and bottom views of a "bent" single channel ground breaker (and of its printed circuit board conductive traces) in accordance with a second embodiment of this invention.
Figure 6B:
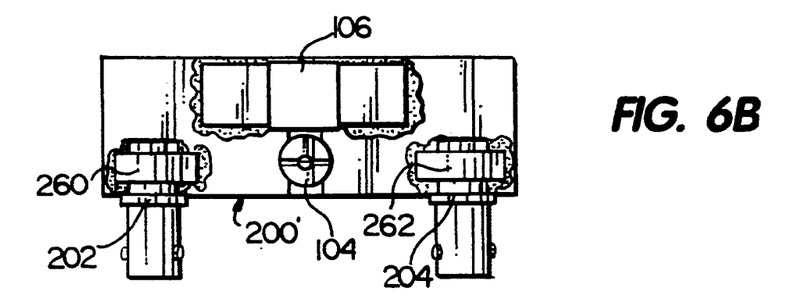
Figure 6C:
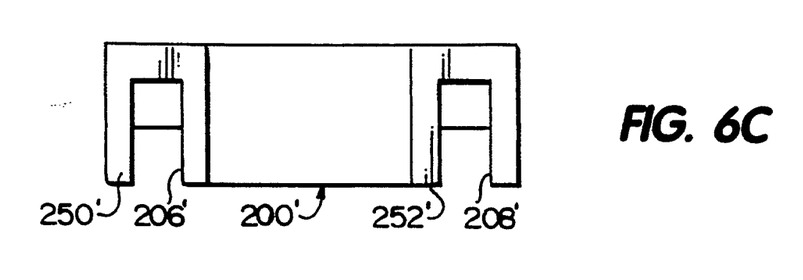
Figure 6D:
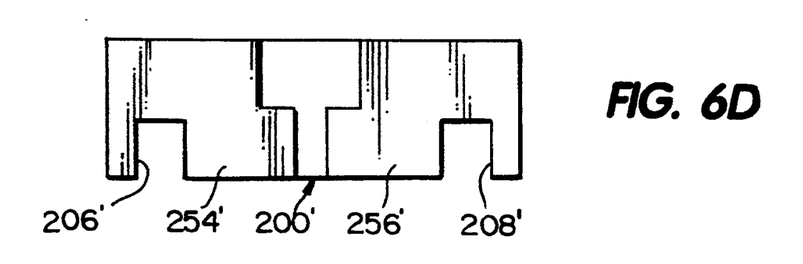

Once both sides of the printed circuit board 200 have been etched, respectively corresponding top and bottom circuit conductor traces 250 and 254 at one end of printed circuit board 200 may be interconnected by soldering strips of thin copper along the printed circuit board sides or by providing a sufficient number of via connections to secure good RF connection between corresponding top and bottom circuit conductor traces and/or by soldering the outer conductor of coaxial connector 202 to both of these circuit traces. Top and bottom printed circuit traces 252 and 256 at the other end of printed circuit board 200 are similarly interconnected. In the preferred embodiment, additional strips of (preferably thicker) copper 260, 262 are also soldered into place on the back side of printed circuit board 200 to help support the connectors 202, 204. The outer threaded side of the connector is soldered to the printed circuit copper conductive traces on both sides of the PCB as well.

Inductor 102 comprises the outer conductor of the coiled coaxial cable. For the exemplary embodiments of single channel ground breakers, we use eleven complete turns of 0.085 inch diameter semi-rigid cable (Soft-Form BP 50085). The cable first may be wrapped around a cylinder with a 0.5 inch diameter, one turn touching the next for eleven complete turns. About one inch of cable may be left on each side to form pigtail, axially directed, ends 270, 272. The outer cable conductor ends are soldered to printed circuit traces 250, 252 while the projecting inner conductor is exposed at each end and soldered to the respectively corresponding inner conductor of coaxial cable connectors 202, 204 as depicted in FIG. 5A. To get proper spacing between turns after the initial coil formation around the cylinder with touching turns, a knife or thin bladed screwdriver may be used to separate each turn from the next. To help get uniform spacing, the coil again may be placed over the forming cylinder and compressed as much as possible. The finished inductor should be approximately ⅝ inch in diameter and the eleven turns should be approximately 1.5 inch long when completed for this exemplary embodiment.

While it may be possible to use a single variable capacitor for tuning purposes, the preferred exemplary embodiment uses a fixed capacitor 106 (e.g., a 150 pf capacitor available from Murata Erie UFP1 151J) together with a parallel connected variable capacitor 104 (e.g., a 15-60 pf capacitor available from Murata Erie DV11 PS 60Q).

The exemplary embodiment is dimensioned to cooperate with an MRI system having a main polarizing magnetic field of approximately 0.35 Tesla producing proton NMR RF frequencies on the order of 15 MHz.

A second single channel RF ground breaker embodiment is depicted at FIGS. 6A–6D. This embodiment is directly analogous to that of FIGS. 5A–5D and similar reference numbers have been used to depict similar parts (with a ' added to denote changes that have been made so as to reorient connectors 202 and 204 to a single side of printed circuit board 200').

Figure 7:
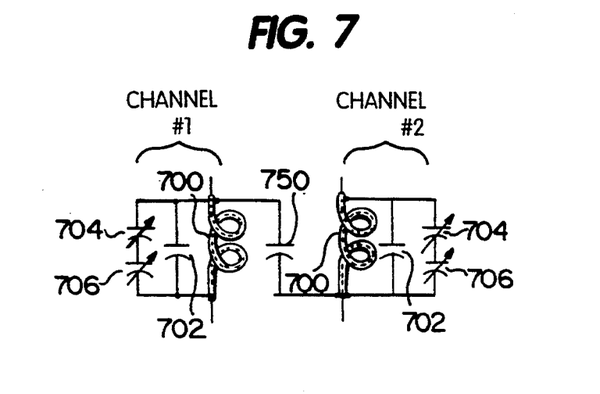
FIG. 7 is a schematic diagram of a double channel RF ground breaker in accordance with yet another embodiment of this invention.

A two channel or "double" RF ground breaker embodiment is schematically depicted at FIG. 7. Here, each channel comprises a coil coaxial cable 700 (the outside conductor of which forms an inductance) and parallel tuning capacitances 702, 704 and 706. As depicted, capacitances 704 and 706 are variable and are connected in series to help distribute the maximum voltage disposed across each. As previously noted, approximately simultaneous and equal adjustments may be made to capacitors 704 and 706 so as to maintain equal voltage distribution across these two variable capacitors.

Since there may be undesirable effects caused by inter-channel coupling between the two adjacent ground breaker channels, a neutralizing capacitance 750 is purposefully connected between the two channels. By judicious selection of connection points and of the capacitance value, such a neutralizing capacitor will purposely couple the correct magnitude of anti-phase RF signals so as to substantially cancel the unavoidable coupling otherwise experienced between these two channels.

Figure 8A:
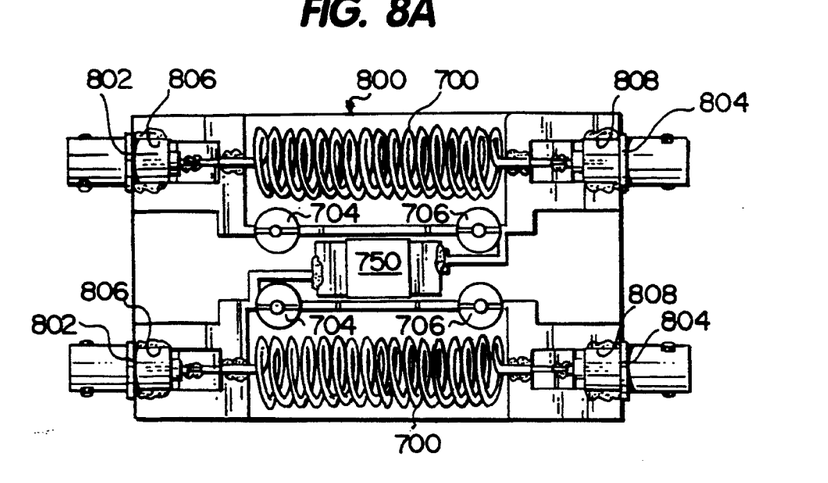
FIGS. 8A–8D are top and bottom views of a double ground breaker (and of its printed circuit board traces) for the third exemplary embodiment of this invention.
Figure 8B:
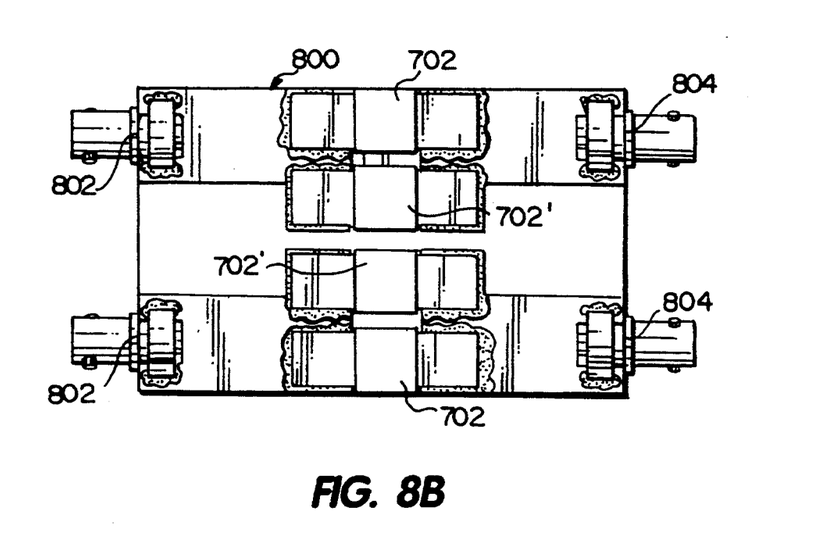

The top and bottom of double ground breaker printed circuit board 800 is depicted in FIGS. 8A and 8B, respectively. As before, each channel includes RF coaxial connectors 802, 804 disposed in printed circuit board recesses 806, 808. Inductors 700 comprise seventeen turns of 0.085 inch diameter semi-rigid cable (Soft-Form BP 50085). Here, the cable was first wound around a forming cylinder with a 0.375 inch diameter, one turn touching the next. After making seventeen complete turns, the turns were then spaced apart from one another using a knife or thin bladed screwdriver. Subsequently, to obtain more even spacing, the coil may be placed again over the forming cylinder and compressed. The finished conductor should be approximately 0.5625 inch in diameter and approximately 2 inches long.

The series tuning capacitances 704, 706 are, in this exemplary embodiment, located on the top side of printed circuit board 800. In the exemplary embodiment, the variable capacitors may each be a 15-60 pf variable capacitor available from Murata Erie (part no. DV11 PS 60Q). Neutralizing capacitor 750 is, in the exemplary embodiment, a fixed capacitor of 12 pf (e.g., Murata Erie UFP1 120J).

As depicted in FIG. 8B, the fixed capacitance 702 is connected on the back side of printed circuit board 800. As depicted it comprises two parallel capacitors (e.g., 120 pf Murara Erie UFP1 121J and a 43 pf Murata Erie UFP1 430J). However, in a production embodiment, a single 160 pf capacitor probably would be utilized (e.g., Murata Erie UFP1 161J).

Figure 8C:
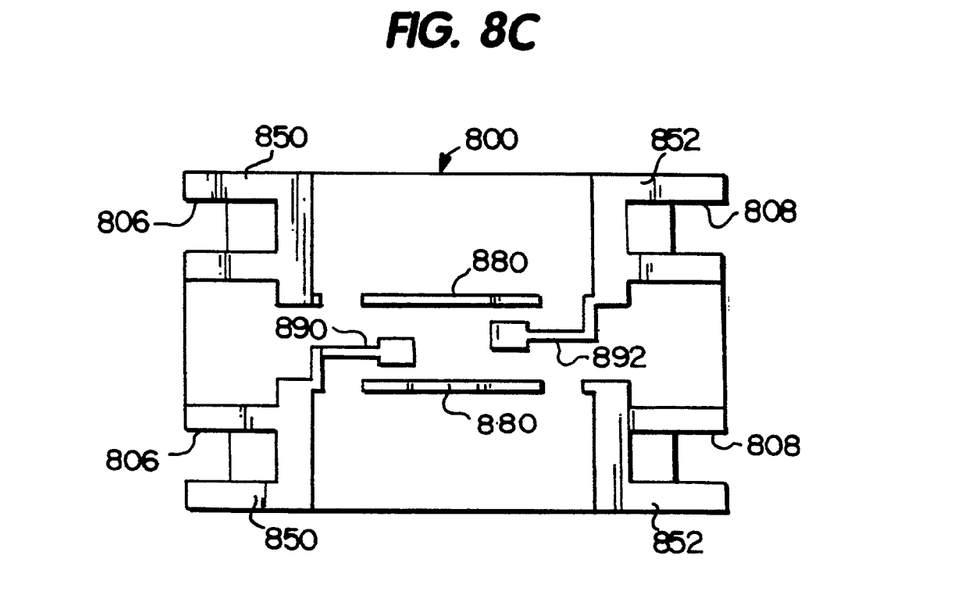
Figure 8D:
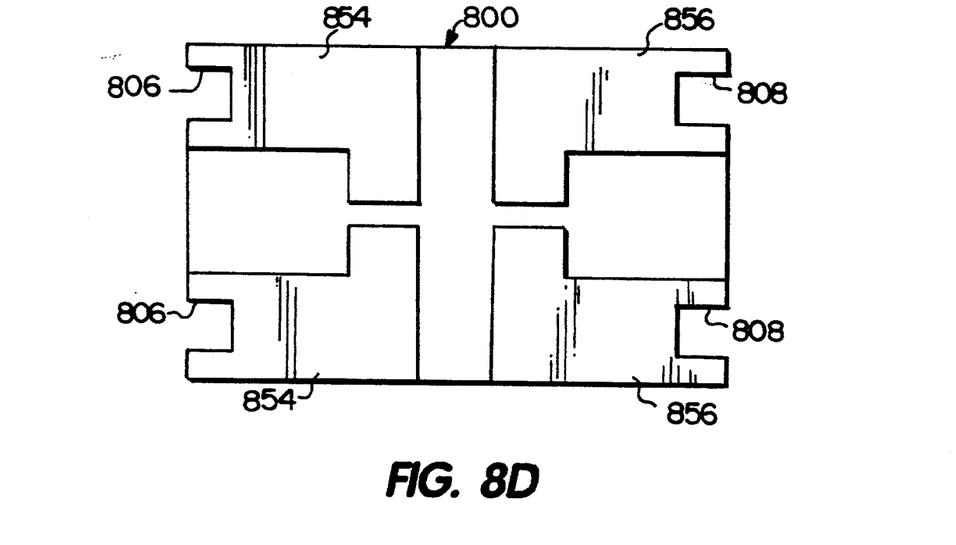

The printed circuit conductive traces are shown for the front and back sides of printed circuit board 800 in FIGS. 8C and 8D, respectively. As will be appreciated, traces 850, 852 on the top side and traces 854 and 856 on the bottom side are analogous to traces 250, 252 and 254, 256 for the single channel embodiments. As with the single channel embodiments, traces 850 and 854 on the top and bottom sides are connected together (albeit separately for each channel) while corresponding traces 852, 856 are similarly interconnected (e.g., by added edge solder conductors and/or through the connection of coaxial cable connectors to both sides of the printed circuit board structure. As can be seen in FIG. 8C, additional conductive traces 880 are added to facilitate connection of series variable tuning capacitances 704 and 706. In addition, conductive traces 890 and 892 are added to facilitate connection of neutralizing capacitor 750 between opposite ends of inductors 700 for the two channels of the double RF ground breaker.

In use, a particular ground breaker may be roughly tuned using a vector impedance meter by adjusting the variable tuning capacitors until the measured phase angle is approximately 0° with maximum impedance at the desired blocking frequency (e.g., approximately 15 MHz in the exemplary embodiments). However, it is preferred that the ground breaker be more finely tuned for use with a specific MRI RF coil using a network analyzer and the specific RF coil in question. Here, while measuring the S11, a Smith chart format mode of network analyzer operation may be utilized (e.g., using a center frequency of 15 MHz with a frequency span of approximately 0.8 MHz in the exemplary embodiment). After calibrating the network analyzer with an attached transmission line, the free end of the transmission line may then be connected to the ground breaker (which is, in turn, already incorporated into the specific RF coil structure in question). Thereafter, the MRI RF coil itself may be tuned to a matching impedance (e.g., 50 ohms) after which the variable capacitors on the ground breaker may be finely adjusted so as to maximize the size of parallel resonance response circle of the ground breaker. Here, the Q of the MRI RF coil is to be maximized and the size of the measured Smith chart circle is proportional to the Q. As previously noted, if serially connected similarly sized variable capacitors are utilized, then they are preferably varied approximately simultaneously and by equal amounts so as to maintain approximately equal capacitors (and therefore equal voltage distributions across those capacitors). The RF ground breakers of this invention are sufficiently compact and robust so that they can be directly mounted on the RF coil structure of an MRI system, thus becoming a part of that structure which is simultaneously moved whenever the RF coil structure is moved. This avoids Q degradation problems encountered with bunched interconnecting cables between the RF coil and the ground breakers of the Harrison et al prior art.

Although only a few exemplary embodiments have been described in detail, those skilled in the art will recognize that many variations and modifications may be made in these exemplary embodiments while yet retaining many of the novel features and advantages of this invention. Accordingly, all such modifications and variations are intended to be included within the scope of the appended claims.

What is claimed is:

1. In combination, an assembly of multiple coaxial cable RFI chokes mounted on an MRI RF coil structure, said assembly comprising:
   a printed circuit board;
   a plurality of coaxial cable RFI chokes mounted on said printed circuit board, and
   at least one neutralizing RF coupling disposed between individual ones of said RFI chokes for reducing the effective RF coupling therebetween.

2. A coaxial cable RFI choke assembly for reducing transmission, via an outer coaxial cable conductor, of spurious RF signals having predetermined frequency, said choke assembly comprising:
   a printed circuit board;
   a first coaxial cable RFI choke mounted on said printed circuit board and having a coiled coaxial cable with an outer conductor connected in parallel via printed circuit conductors across a first variable tuning capacitor;
   a second coaxial cable RFI choke mounted on said printed circuit board and having a coiled coaxial cable with an outer conductor connected in parallel via printed circuit conductors across a second variable tuning capacitor; and
   at least one neutralizing capacitor connected between said coiled coaxial cables for reducing RF coupling therebetween.

3. A coaxial cable RFI choke assembly as in claim 2 wherein at least one component of each RFI choke is disposed on both sides of said printed circuit board.

4. A coaxial cable RFI choke assembly as in claim 2 wherein said coiled coaxial cables comprise semi-rigid coaxial cable.

5. A coaxial cable RFI choke assembly as in claim 2 including a coaxial connector disposed at each end of each coiled coaxial cable and having an outer connector conductor which is mounted within a recess on the printed circuit board and connected to printed circuit conductors on both sides of the printed circuit board.

6. A coaxial cable RFI choke assembly for reducing transmission via an outer coaxial cable conductor, of RF signals having a predetermined range of frequencies, said choke assembly being especially useful in coupling RF coils of MRI systems to MRI RF signal processors and comprising:
   a printed circuit board having printed circuit conductors on both sides of an insulating substrate;
   a coiled coaxial cable having an outer conductor at each end affixed to respective first and second printed circuit conductors on a first side of the printed circuit board;
   further first and second printed circuit conductors disposed on the second side of the printed circuit board and respectively connected to the first and second printed conductors disposed on the first side of the printed circuit board;
   at least one capacitor disposed and connected between the first and second printed conductors on the second side of the printed circuit board;
   a first coaxial cable connector mounted in a first recess on the circuit board, coupled to an end of the coiled coaxial cable and having an outer conductor which is connected to the first printed conductors on both the first and second sides of the printed circuit board:
   a second coaxial cable connector mounted in a second recess on the circuit board, coupled to the other end of the coiled coaxial cable and having an outer conductor which is connected to the second printed conductors on both the first and second sides of the printed circuit board; and
   a fixed capacitor and a variable capacitor are mounted in parallel across the third and fourth conductors on the other side of the printed circuit board.

7. A coaxial cable RFI choke assembly for reducing transmission, via an outer coaxial cable conductor, of RF signals having a predetermined range of frequencies said choke assembly being especially useful in coupling RF coils of MRI systems to MRI RF signal processors and comprising:
   a printed circuit board having printed circuit conductors on both sides of an insulating substrate;
   a coiled coaxial cable having an outer conductor at each end affixed to respective first and second printed circuit conductors on a first side of the printed circuit board;
   further first and second printed circuit conductors disposed on the second side of the printed circuit board and respectively connected to the first and second printed conductors disposed on the first side of the printed circuit board;

at least one capacitor disposed and connected between the first and second printed conductors on the second side of the printed circuit board;

a further coiled coaxial cable having an outer conductor at each end affixed to respective third and fourth printed circuit conductors on one side of the printed circuit board;

further third and fourth printed circuit conductors disposed on the other side of the printed circuit board and respectively connected to the third and fourth printed conductors disposed on the said one side of the printed circuit board; and at least one further capacitor disposed and connected between the third and fourth printed conductors on the other side of the printed circuit board.

8. A coaxial cable RFI choke assembly as in claim 7 wherein:

a fixed capacitor is mounted between the third and fourth printed conductors on the other side of the printed circuit board; and a variable capacitor is mounted between the third and fourth conductors on the one side of the printed circuit board.

9. A coaxial cable RFI choke assembly as in claim 7 wherein:

two variable capacitors are mounted serially between the third and fourth printed conductors of the printed circuit board.

10. A coaxial cable RFI choke assembly as in claim 7 comprising at each of the four ends of said two coiled coaxial cables:

a coaxial cable connector mounted in a recess on the circuit board, coupled to an adjacent end of a coiled coaxial cable and having an outer conductor which is connected to printed circuit conductors on both sides of the printed circuit board.

11. A coaxial cable RFI choke assembly as in claim 7 further comprising:

at least one decoupling capacitor connected between said coiled coaxial cables.

12. A magnetic resonance imaging (MRI) system comprising:

a main magnet providing a background NMR polarizing magnetic field in an image volume;

pulsed magnetic gradient coils disposed within said magnet;

an RF coil assembly also disposed within said magnet and within said gradient coils; and a coaxial cable RFI choke assembly disposed upon and immediately proximate said RF coil assembly and having at least two coiled coaxial RF transmission lines for conducting MRI, RF signals via an inner conductor, said coiled coaxial RF transmission lines each having: (a) an outer sheath conductor affixed to a printed circuit conductor at opposite ends of the coil and (b) at least one variable capacitor connected in parallel thereto via said printed circuit.

13. A magnetic resonance imaging (MRI) system as in claim 12 wherein said RFI choke assembly is mounted within said RF coil assembly.

14. A magnetic resonance imaging (MRI) system as in claim 12 wherein said printed circuit is disposed on a board having substantially only RFI choke assembly components thereon.

15. A magnetic resonance imaging (MRI) system as in claim 14 wherein said coaxial RF transmission line comprises a semi-rigid coaxial cable.

16. A magnetic resonance imaging (MRI) system as in claim 14 wherein said RFI choke assembly includes a coaxial cable connector affixed to each end of said coaxial RF transmission lines and mounted to opposite sides of said printed circuit board.

17. A magnetic resonance imaging (MRI) system as in claim 14 wherein said RFI choke assembly includes a coaxial cable connector affixed to each end of said coaxial RF transmission lines and mounted to the same side of said printed circuit board.

18. A magnetic resonance imaging (MRI) system as in claim 12 further comprising:

at least, one capacitor connected between each of said coiled coaxial RF transmission lines via printed circuit conductors for cancelling inter-coil coupling effects.

19. A magnetic resonance imaging (MRI) system as in claim 18 wherein said RFI choke assembly is mounted within said RF coil assembly.

20. A magnetic resonance imaging (MRI) system as in claim 18 wherein said printed circuit is disposed on a board having substantially only RFI choke assembly components thereon.

21. A magnetic resonance imaging (MRI) system as in claim 20 wherein said coaxial RF transmission lines comprise a semi-rigid coaxial cable.

22. A magnetic resonance imaging (MRI) system as in claim 20 wherein said RFI choke assembly includes a coaxial cable connector affixed to each end of said coaxial RF transmission line and mounted to opposite sides of said printed circuit board.

* * * * *